United States Patent
Chen et al.

(10) Patent No.: US 7,607,790 B2
(45) Date of Patent: Oct. 27, 2009

(54) BACKLIGHTING APPARATUS AND MANUFACTURING PROCESS

(75) Inventors: Shou Lung Chen, Hong Kong (CN); Kwan Wah Ng, Hong Kong (CN); Ying Liu, Hong Kong (CN)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 0 days.

(21) Appl. No.: 11/640,587

(22) Filed: Dec. 18, 2006

(65) Prior Publication Data

US 2008/0144315 A1 Jun. 19, 2008

(51) Int. Cl.
*G09F 13/04* (2006.01)
*G02F 1/13* (2006.01)

(52) U.S. Cl. .................. 362/97.1; 174/252; 349/69; 362/294; 362/800; 362/373

(58) Field of Classification Search .............. 362/294, 362/800, 630–631, 373, 249, 97.1, 97.2, 362/97.3, 97.4; 361/704, 707, 719–721; 174/252, 255; 349/69
See application file for complete search history.

(56) References Cited

U.S. PATENT DOCUMENTS 4,408,255 A * 10/1983 Adkins ................. 361/689
4,480,255 A * 10/1984 Davidson ................ 343/844
5,208,732 A * 5/1993 Baudouin et al. .......... 361/704
5,836,676 A * 11/1998 Ando et al. .............. 362/244
2005/0180142 A1 8/2005 Tsai
2006/0002142 A1 1/2006 Jeong et al.

\* cited by examiner

*Primary Examiner*—Ismael Negron
*Assistant Examiner*—Robert J May
(74) *Attorney, Agent, or Firm*—Ryan A. Schneider, Esq.; Troutman Sanders LLP

(57) ABSTRACT

Apparatuses for backlighting and manufacturing processes thereof are disclosed. There is provided a backlight module. The backlight module comprises a double-sided circuit board with thermal conducting material as one of the core layers; a plurality of light source components mounted on the first surface of the circuit board; and, a plurality of electronic components mounted on the second surface of the circuit board. The thermal conducting core layer discharges heat generated by the light source components. The circuit board has at least one window on the surface layer at the second surface to expose the thermal conducting core layer for thermal dissipation. As such, the component heights on the illuminating side of the circuit board are unified, and the reflector can be made as a smooth planar sheet to provide a more uniform backlight illumination compared to a single-side circuit board design. Further, such an arrangement reduces the complexity in manufacturing the reflector and hence the cost thereof.

21 Claims, 7 Drawing Sheets

BACKLIGHTING APPARATUS AND MANUFACTURING PROCESS

BACKGROUND OF THE INVENTION

1. Field of the Invention

The present invention relates generally to backlight modules and, in particular, to backlight modules using light emitting diodes (LED) as light sources and providing backlight for liquid crystal display (LCD) devices.

2. Description of Related Art

For typical design of LED backlight modules, a single-side design has long been adopted, meaning that all the LED components and other electronic components, including LED drivers and passive components, are mounted on the same side of the circuit board. To handle the problem caused by heat dissipation of the LED components, a metal core printed circuit board (MCPCB) has been used as the circuit board in conventional technology. The aluminum layer at the bottom of the MCPCB can serve a similar purpose as a heat sink and discharge the heat generated by the electronic components, especially the LED components.

Such single-side designs, however, have a problem caused by those electronic components that are of a greater height than the LED components. An optical reflector for diffusing emitted light normally has to be kept at an optimal distance from the LED components to give a satisfactory light diffusion effect. The optimal distance is usually less than the maximum height of those electronic components, and therefore the reflector has to be molded into irregular shape instead of a smooth planar structure. Consequently, uniform backlight cannot be provided because of the irregular shape of the reflector. Further, extra manufacturing costs are incurred for an irregularly shaped reflector.

Accordingly, a need exists for improved methods and apparatuses of backlighting that adopt smooth planar reflectors.

BRIEF SUMMARY OF THE INVENTION

In accordance with an aspect of the invention, there is provided a backlight module. The backlight module comprises: double-sided circuit board with thermal conducting material as one of the core layers; a plurality of light source components mounted on the first surface of said circuit board; a plurality of electronic components mounted on the second surface of said circuit board. The thermal conducting core layer discharges heat generated by said light source components. The circuit board has at least one window on the surface layer at the second surface to expose said thermal conducting core layer for thermal dissipation.

The backlight module may further comprise a thermal dissipating planar structure to cover the second surface of said circuit board. The planar structure has a protruding portion on the inner side to be in contact with said thermal conducting core layer of said circuit board through said window.

The backlight module may further have a thin thermal interface material mediates between the thermal conducting core layer of the circuit board and the protruding portion of the planar structure.

The planar structure may have at least one window to expose said circuit components on said circuit board for dissipating heat generated by said circuit components.

The planar structure may constitute part of a light box which accommodates said backlight module.

In accordance with a further aspect of the invention, there is provided a backlight system being assembled by arranging laterally a plurality of above backlight modules. The backlight modules are interconnected by electrical connectors.

The material composing said thermal conducting core layer may be aluminum, aluminum alloy, ceramic or copper. The thermal dissipating planar structure may be made of materials such as aluminum, aluminum alloy, steel or copper. The thermal interface material may be thermal grease, thermally conductive gap fillers, phase change thermal interface material or thermal conductive adhesive/tape.

The light source components may be light emitting diodes.

The backlight module may further comprise an optical cover plate which is disposed over said light source components for diffusing light emitted therefrom.

In accordance with a further aspect of the invention, there is provided a process for manufacturing a backlight module. The process comprises the steps of:

providing light sources components and electronic components;

fabricating conductive pathways on double-sided circuit board with thermal conducting material as one of the core layers;

fabricating at least one window on the surface layer at the second surface of said circuit board to expose said thermal conducting core layer for thermal dissipation;

assembling light source components on the first surface of said circuit board; and assembling other electronic components on the second surface of said circuit board.

The process for manufacturing a backlight module may further comprise the step of attaching a thermal dissipating planar structure to cover the second surface of said circuit board, wherein said planar structure has a protruding portion on the inner side to be in contact with said thermal conducting core layer of said circuit board through said window.

The process for manufacturing a backlight module may further comprise the step of mediating a thin thermal interface material between said thermal conducting core layer of said circuit board and said protruding portion of said planar structure.

The planar structure may have at least one window to expose said circuit components on said circuit board for dissipating heat generated by said circuit components.

The planar structure may constitute part of a light box which accommodates said backlight module.

In accordance with a further aspect of the invention, there is provided a process for manufacturing a backlight system. The process comprises the steps of arranging laterally a plurality of backlight modules manufactured from above processes, wherein said backlight modules are interconnected by electrical connectors.

The material composing said thermal conducting core layer may be aluminum, aluminum alloy, ceramic and copper. The thermal dissipating planar structure may be made of materials such as aluminum, aluminum alloy, steel and copper. The thermal interface material may be thermal grease, thermally conductive gap fillers, phase change thermal interface material and thermal conductive adhesive/tape.

The light source components may be light emitting diodes.

The process for manufacturing a backlight module may further comprise the step of disposing an optical cover plate over said light source components for diffusing light emitted therefrom.

BRIEF DESCRIPTION OF THE FIGURES

One or more embodiments are described hereinafter, by way of example only, with reference to the accompanying drawings in which.

DETAILED DESCRIPTION OF PREFERRED EMBODIMENTS

Figure 1:
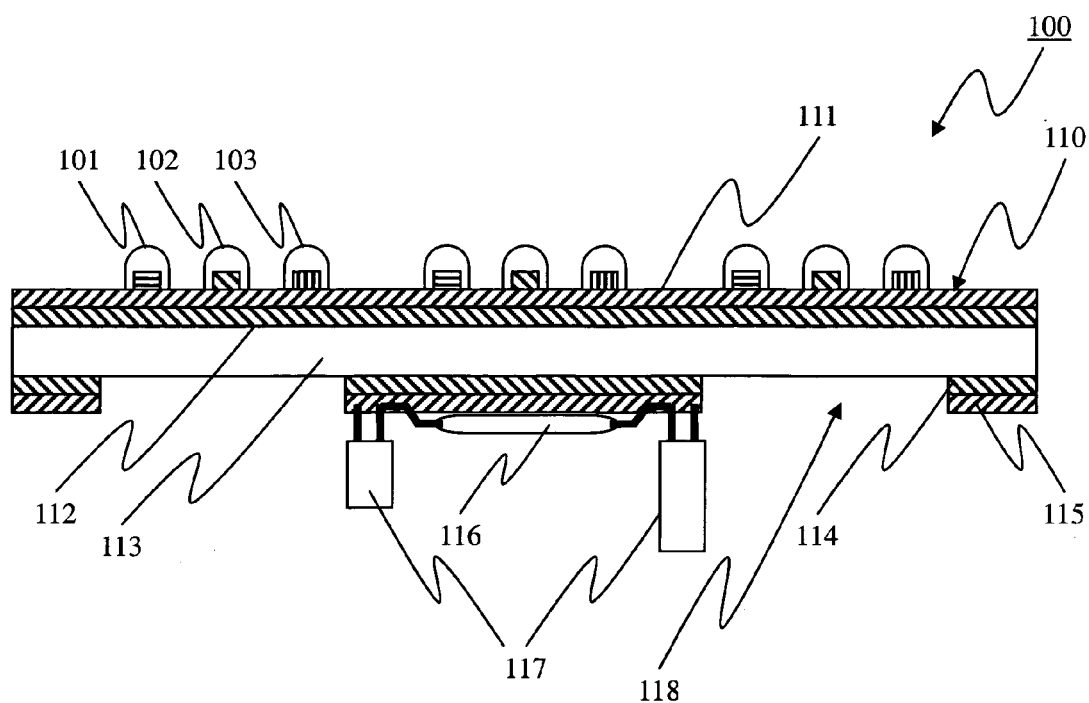
FIG. 1 is a cross-sectional view of a backlight module in accordance with an embodiment of the present invention.

A backlighting apparatus and manufacturing process thereof are described herinafter. In the following description, numerous specific details, including manufacturing materials, circuit components, and the like are set forth. However, from this disclosure, it will be apparent to those skilled in the art that modifications and/or substitutions may be made without departing from the scope and spirit of the invention. In other circumstances, specific details may be omitted so as not to obscure the invention.

Where reference is made in any one or more of the accompanying drawings to steps and/or features, which have the same reference numerals, those steps and/or features have for the purposes of this description the same function(s) or operations(s), unless the contrary intention appears.

The embodiments of the invention improve the performance of conventional LED backlight modules. This includes adapting double-side circuit board design for the module, so that only LED components are mounted on the illuminating side of the circuit board while other electronic components, including driver ICs and passive components are mounted on the other side. As such, the component heights on the illuminating side of the circuit board are unified, and the reflector can be made as a smooth planar sheet to provide a more uniform backlight illumination compared to a single-side circuit board design. Further, such an arrangement reduces the complexity in manufacturing the reflector and hence the cost thereof.

In a conventional single-side circuit board design, the bottom surface is a metal layer that dissipates heat generated by the LED components. If the electronic components except the LEDs are allocated to the bottom side of the circuit board in the embodiment of the present invention, electrically insulating layers and electrically conductive layers are fabricated on the bottom side to provide a printed circuit for the electronic components. Such an arrangement blocks heat dissipation path and can cause overheating problems throughout the backlight module. The overheating problems include component breakdown, circuit failure, degraded performance and shortened lifespan of the components. In particular, the LED components may operate with lower luminosity and give an unexpected wavelength shift on the emitted light.

The embodiments of the present invention provide arrangements to ameliorate the overheating effect and achieve thermal dissipation performance comparable to single-side circuit board design. In one embodiment of the present invention, windows are made on the surface layer areas that are not occupied by electronic components or copper tracks. Such windows expose the aluminum core layer to ambient environment and provide a thermal path for the core layer to discharge heat absorbed from the LED components.

FIG. 1 shows a cross-sectional view of a backlight module 100 in accordance with an embodiment of the present invention. The backlight module 100 is constructed on a double-sided MCPCB 110 comprising a top electrical conductive layer 111, a top electrical insulating layer 112, a core thermal conductive layer 113 made of thermal conducting material such as aluminum, a bottom insulating layer 114 and a bottom electrical conductive layer 115. LED components, which may be in different colors such as red LED 101, green LED 102 and blue LED 103, are mounted on the top electrical conductive layer 111. Other electronics components such as LED driver ICs 116, and passive components 117 are mounted on the bottom electrical conductive layer 115. The electrical conductive layers 111, 115 are patterned to form conductive pathways that connect electronics components 116, 117 to form a driving circuit for driving LED components 101, 102, 103.

Ventilation windows 118 are created on the bottom layers 114, 115 to expose the core layer 113 to ambient environment. The core layer 113 absorbs heat generated by LED components 101, 102, 103 and dissipates such heat energy to ambient environment through the ventilation windows 118.

Figure 2:
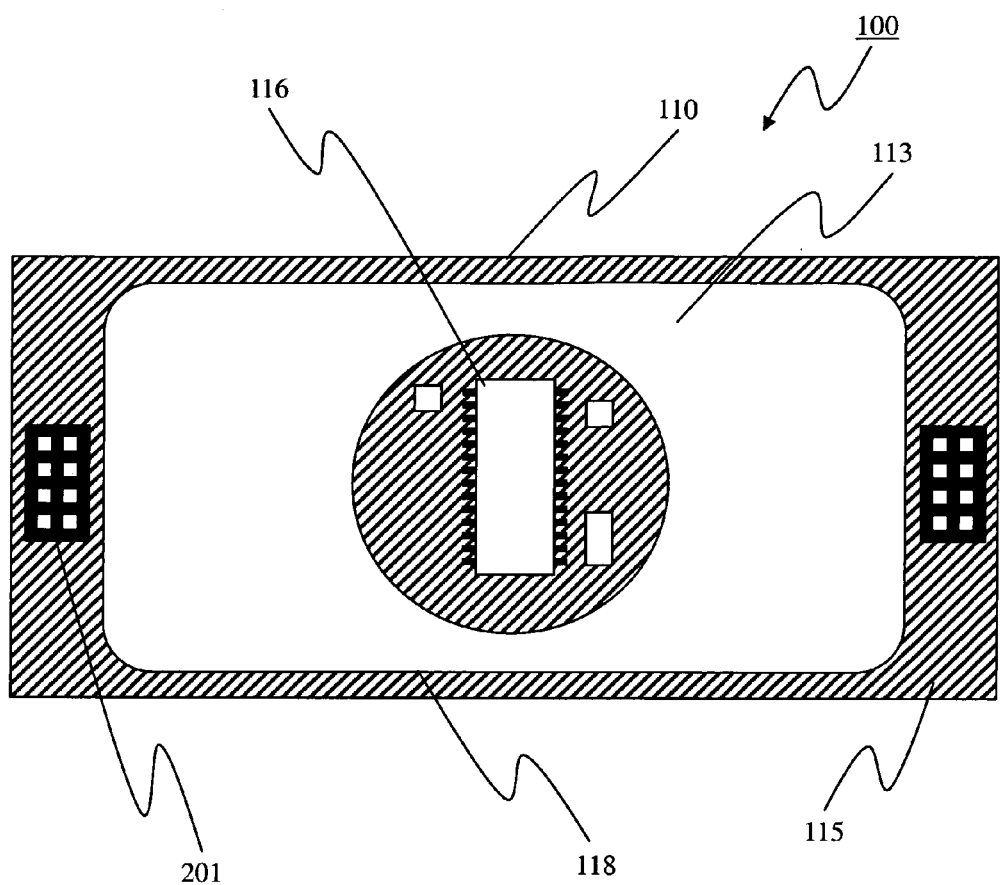
FIG. 2 is a planar view of the LED side of the backlight module in FIG. 1.
Figure 3:
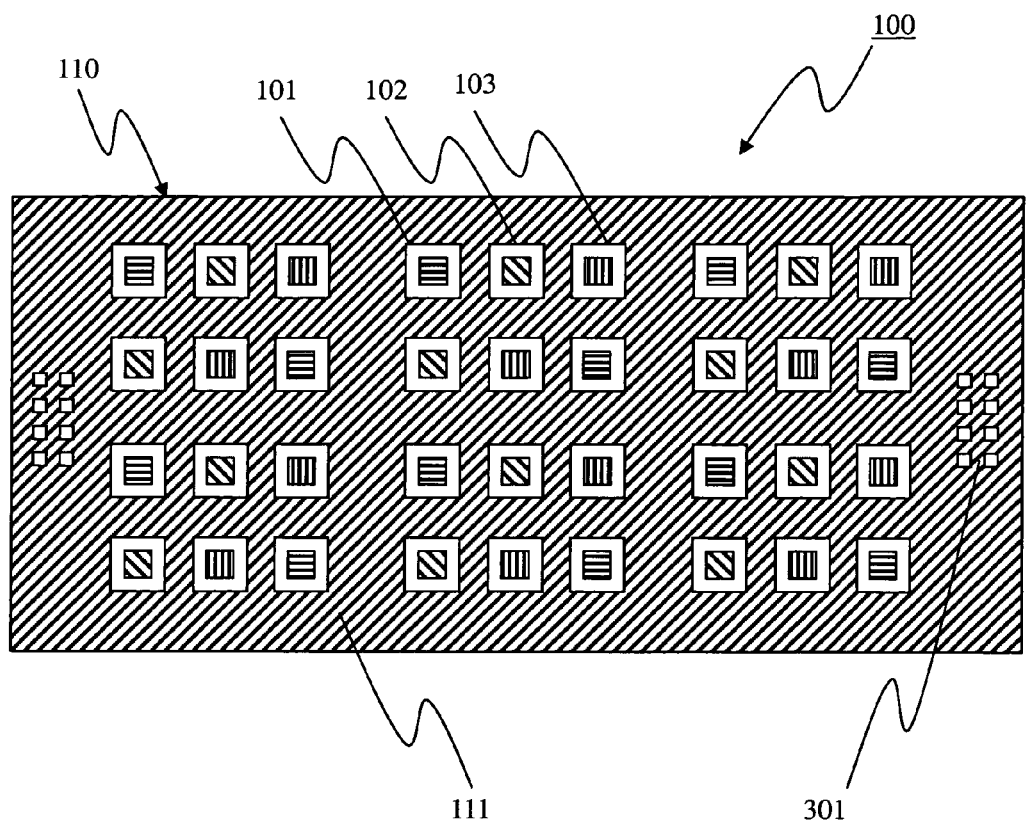
FIG. 3 is a planar view of the electronic component side of the backlight module in FIG. 1.

FIG. 2 shows a planar view of the bottom side of the backlight module 100, whereas FIG. 3 shows a planar view of the top side. Connector sockets 201, 301 are disposed on the peripheral of the module 100 to provide electrical connections to other backlight modules or a main circuit not shown in the figures.

Figure 4:
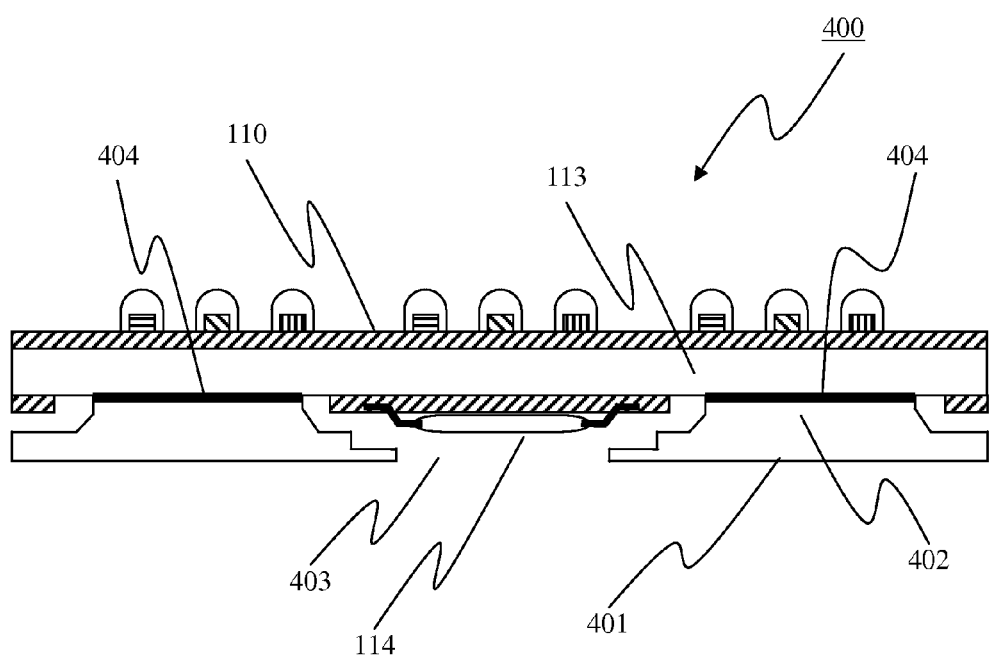
FIG. 4 is a cross-sectional view of a backlight module in accordance with another embodiment of the present invention.

According to another embodiment of the present invention, a heat dissipating structure, which may be the back cover of the light box for housing the backlight modules, is further arranged to facilitate the heat dissipation. The back cover may be may be a planar structure with protruding portions that correspond to the ventilation windows on the backlight module circuit board. When the circuit board is installed into the light box, the protruding portions come into contact with the aluminum core layer. Accordingly, the aluminum core layer, together with the light box back cover, provides a more effective thermal dissipation channel, because the surface area of the light box back cover is greater than the ventilation window on the aluminum core layer FIG. 4 shows a cross-sectional view of a backlight module 400 in accordance with a further embodiment of the present invention. The arrangement is modified from the embodiment of FIG. 1 in that the back cover 401 of the light box under circuit board 110 where said back cover 401 has protruding portions 402 contacting the circuit board thermal conductive core layer 113 through the bottom layer ventilation window 118. The back cover 401 structure may be made of materials such as aluminum, aluminum alloy, steel or copper. A thin thermal interface material 404 is added between the circuit board core layer 113 and light box back cover 401.

In still another embodiment of the present invention, the heat dissipating structure, which may be the back cover 401 of the light box, comprises windows 403 over the position of the electronic components as ventilation openings for the components to dissipate heat through convention.

A large backlight system can be composed by backlight modules described above. The modules are arranged laterally and fixed on the light box back cover. The backlight modules can be interconnected by flat cable connector.

Figure 5:
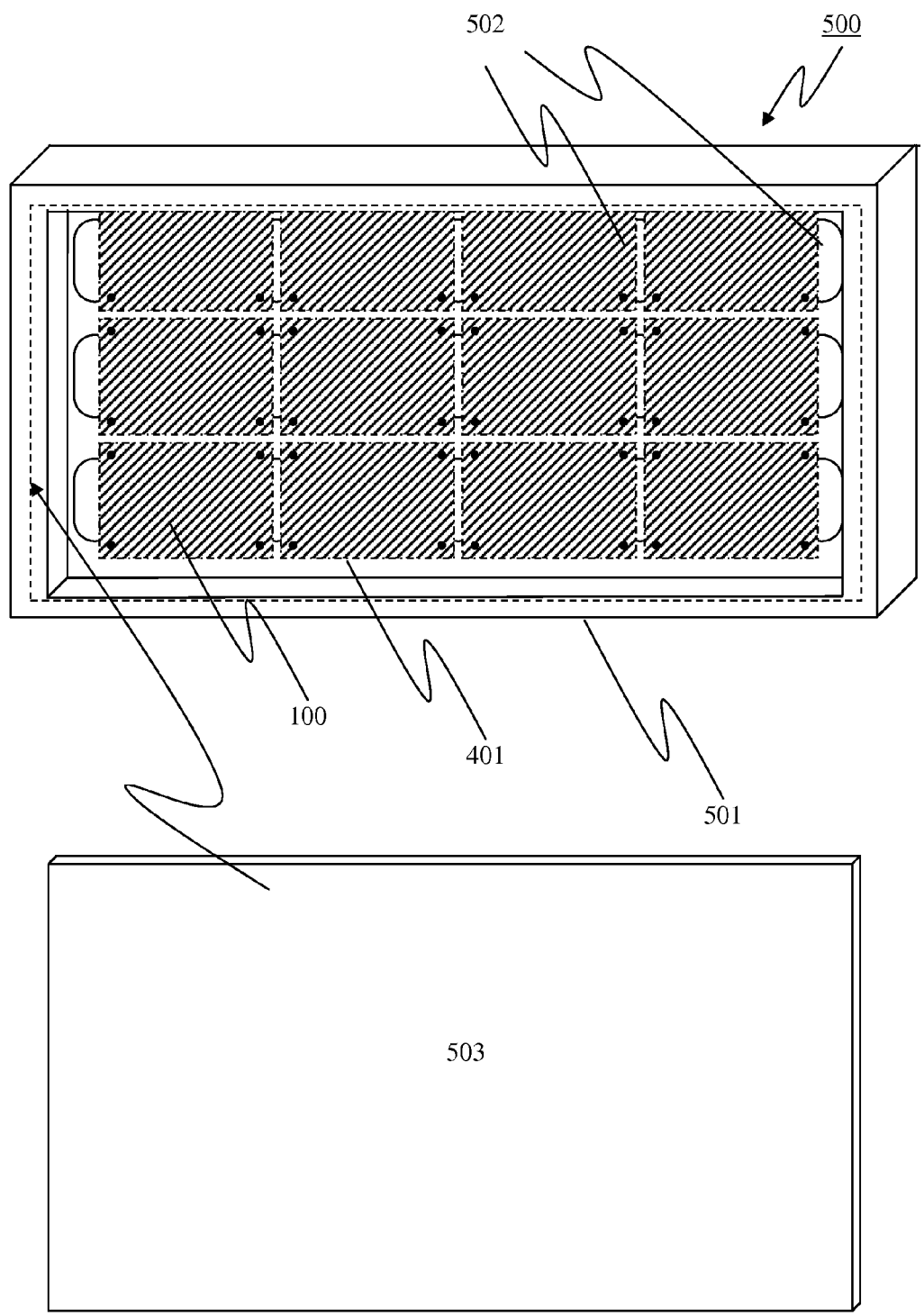
FIG. 5 is a perspective view of a backlight system assembled from backlight modules in accordance with another embodiment of the present invention.

FIG. 5 shows a perspective view of a backlight system 500 assembled from backlight modules 100 of FIG. 1. The backlight modules 100 are fixed on the back cover 401 of the light box 501. Openings 502 are made on the back cover 401 for positioning cable connectors. The backlight module further includes an optical cover plate 503 which is disposed over the components of the light box.

Figure 6:
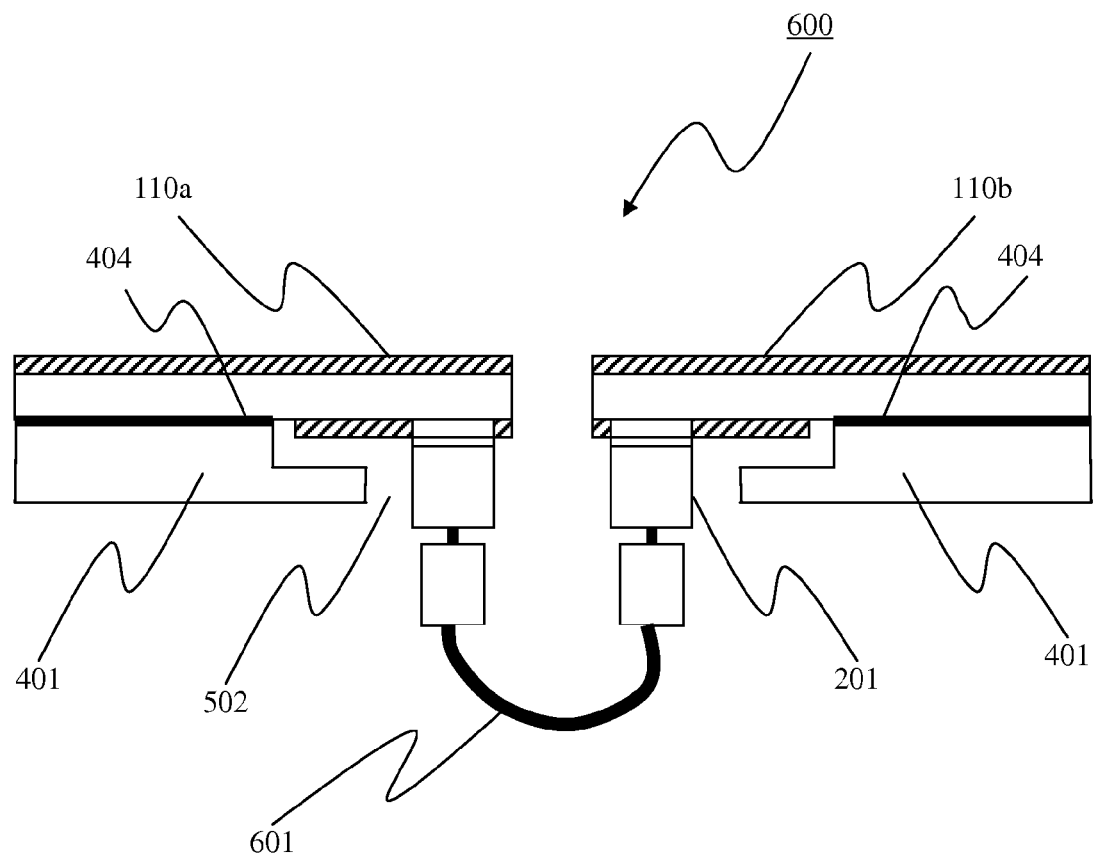
FIG. 6 is a cross-sectional view of the connecting portions between backlight modules of FIG. 5.

FIG. 6 shows a cross-sectional view of the connecting portions 600 between backlight modules 100 of FIG. 5. The connector sockets 201 are arranged on the periphery of the backlight module circuit boards 110*a*, 110*b*. Openings 502 are made in the back cover 401 to accommodate the interconnections 601 between the circuit boards 110*a*, 110*b*, for example, a flat cable connector.

The thermal management of the backlight system can be further enhanced by adding a heat sink to the light box back cover 401. In addition, a thin thermal interface material 404 such as thermal grease can be added between the circuit board core layer 113 and light box back cover 401 at the contact region to reduce the thermal resistance across the two structures.

Figure 7:
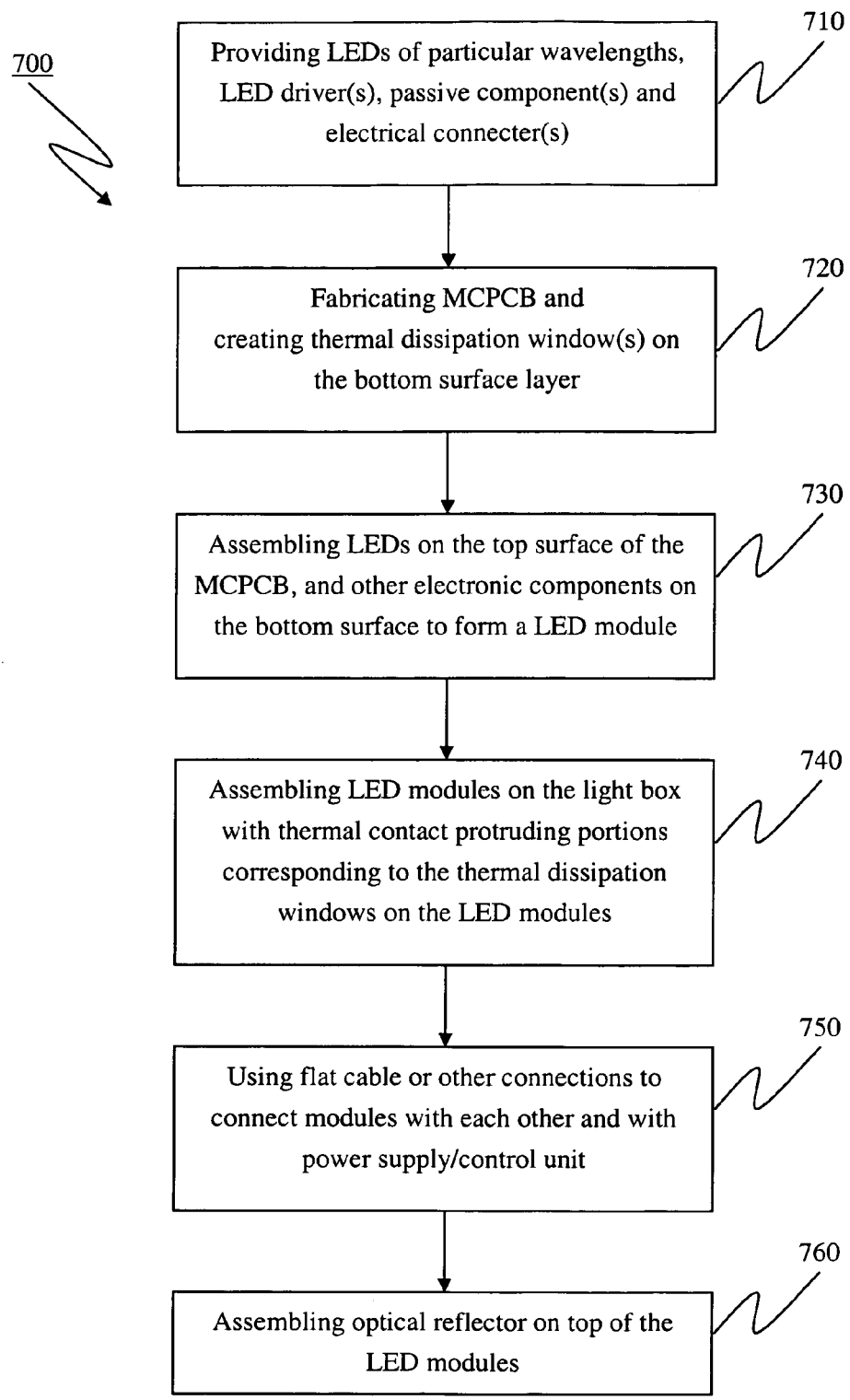
FIG. 7 is a flow diagram illustrating a manufacturing process for the backlight module in accordance with an embodiment of the present invention.

FIG. 7 illustrates a method 700 of manufacturing the backlight module in accordance with an embodiment of the present invention. In step 710, LED components of particular wavelengths, LED drivers, passive components and electrical connectors are provided according to the manufacturing specification.

In step 720, a MCPCB is fabricated with copper strips on the top and bottom surfaces to provide electrical connections for LED components and other electronic components. Thermal dissipation windows are further created on the bottom surface layer to expose the core thermal conductive layer.

In step 730, LED components are assembled on the top surface of the circuit board to form the illuminating side. For example, this may be done using soldering. The other electronic components such as LED drivers, passive components are assembled on the bottom surface. As such, a LED backlight module is formed.

In step 740, the LED backlight modules of step 730 are assembled laterally on the back cover of a light box, in such a way that the thermal contact protruding portions of the back cover contact the aluminum core layer exposed by ventilation windows on the bottom side of the backlight modules. On the one hand, the light box functions as a mechanical housing for the LED backlight system; on the other hand, the light box facilitates the heat dissipation for the system. A thin thermal interface material can be added between the backlight module and the light box at the contact region to reduce the thermal resistance across the two structures.

In step 750, the LED backlight modules mounted on the light box are connected together by flat cables or other connection methods. The flat cables also connect the modules to power supply unit and control unit of the backlight system.

In step 760, an optical reflector is assembled on top of the illuminating side of the LED backlight modules to diffuse the emitted light and provide a more uniform and even backlight illumination.

INDUSTRIAL APPLICABILITY

The embodiments and arrangements described hereinafter are applicable to electronics, lighting and display industries, amongst others.

The foregoing describes only a few embodiments of the present invention, and modifications and/or substitutions can be made thereto without departing from the scope and spirit of the invention, the embodiments being illustrative and not restrictive.

We claim:

1. A display backlight module comprising:
   an LCD display backlight having at least one contiguous double-sided circuit board with a thermal conducting material as one of the core layers thereof, said thermal conducting core layer discharging heat generated by light source components;
   a plurality of light source components mounted on one side of said circuit board; and
   a plurality of electronic components mounted on the opposite side of said circuit board;
   wherein said circuit board has at least one ventilation window formed in a surface layer on the electronic component side of the circuit board exposing said thermal conducting core layer for thermal dissipation and a thermal dissipating planar structure to cover the electronic component side of said circuit board, said planar structure having a protruding portion in contact with said thermal conducting core layer of said circuit board through said ventilation window.

2. A backlight module according to claim 1, further comprising a thin thermal interface material that mediates between said thermal conducting core layer of said display backlight circuit board and said protruding portion of said planar structure.

3. A backlight module according to claim 2, wherein said thermal interface material is selected from the group of materials consisting of thermal grease, thermally conductive gap fillers, phase change thermal interface material and thermal conductive adhesive/tape.

4. A backlight module according to claim 1, wherein said planar structure has at least one ventilation window to expose said circuit components on said display backlight circuit board for dissipating heat generated by said circuit components.

5. A backlight module according to claim 1, wherein said planar structure is part of a light box that accommodates said backlight module.

6. A backlight module according to claim 1, wherein said material composing said thermal conducting material is selected from the group of materials consisting of aluminum, aluminum alloy, ceramic and copper.

7. A backlight module according to claim 1, wherein said thermal dissipating planar structure is made of materials selected from the group of materials consisting of aluminum, aluminum alloy, steel and copper.

8. A backlight module according to claim 1, wherein said light source components are light emitting diodes.

9. A backlight module according to claim 1, further comprising an optical cover plate that is disposed over said light source components for diffusing light emitted therefrom.

10. A backlight system, comprising a plurality of backlight modules according to claim 1 that are arranged laterally and a plurality of electrical connectors, said backlight modules being interconnected by said electrical connectors.

11. A process for manufacturing a display backlight module, comprising the steps of:

fabricating conductive pathways on a contiguous double-sided circuit board wherein the circuit board is adapted to be used in an LCD display backlight and has a thermal conducting material as one of the core layers thereof;

fabricating at least one ventilation window on a surface layer on one side of said circuit board exposing said one of the thermal conducting core layers for thermal dissipation;

assembling light source components on the opposite side of said circuit board; and assembling other electronic components on the windowed side of said circuit board.

12. The process for manufacturing a backlight module according to claim 11, further comprising the step of attaching a thermal dissipating planar structure to cover the electronic component side of said display backlight circuit board, said planar structure having a protruding portion in contact with said thermal conducting core layer of said circuit board through said ventilation window.

13. The process for manufacturing a backlight module according to claim 12, further comprising the step of mediating a thin thermal interface material between said thermal conducting core layer of said display backlight circuit board and said protruding portion of said planar structure.

14. The process for manufacturing a backlight module according to claim 13, wherein said thermal interface material is selected from the group of materials consisting of thermal grease, thermally conductive gap fillers, phase change thermal interface material and thermal conductive adhesive/tape.

15. The process for manufacturing a backlight module according to claim 12, wherein said planar structure has at least one ventilation window to expose said circuit components on said display backlight circuit board for dissipating heat generated by said circuit components.

16. The process for manufacturing a backlight module according to claim 12, wherein said planar structure is part of a light box that accommodates said backlight module.

17. The process for manufacturing a backlight module according to claim 12, wherein said thermal dissipating planar structure is made of materials selected from the group of materials consisting of aluminum, aluminum alloy, steel and copper.

18. The process for manufacturing a backlight system, comprising the steps of arranging laterally a plurality of backlight modules manufactured from process according to claim 11, said backlight modules being interconnected by electrical connectors.

19. The process for manufacturing a backlight module according to claim 11, wherein said material composing said thermal conducting core layer is selected from the group of materials consisting of aluminum, aluminum alloy, ceramic and copper.

20. The process for manufacturing a backlight module according to claim 11, wherein said light source components are light emitting diodes.

21. The process for manufacturing a backlight module according to claim 11, further comprising the step of disposing an optical cover plate over said light source components for diffusing light emitted therefrom.

* * * * *